(12) United States Patent
Thalheim

(10) Patent No.: US 11,469,756 B2
(45) Date of Patent: *Oct. 11, 2022

(54) MULTI-STAGE GATE TURN-OFF WITH DYNAMIC TIMING

(71) Applicant: Power Integrations, Inc., San Jose, CA (US)

(72) Inventor: Jan Thalheim, Biel (CH)

(73) Assignee: Power Integrations, Inc., San Jose, CA (US)

( * ) Notice: Subject to any disclaimer, the term of this patent is extended or adjusted under 35 U.S.C. 154(b) by 362 days.

This patent is subject to a terminal disclaimer.

(21) Appl. No.: 16/863,845

(22) Filed: Apr. 30, 2020

(65) Prior Publication Data

US 2020/0259488 A1    Aug. 13, 2020

Related U.S. Application Data

(63) Continuation of application No. 15/785,816, filed on Oct. 17, 2017, now Pat. No. 10,680,604, which is a
(Continued)

(51) Int. Cl.
*H03K 17/56* (2006.01)
*H03K 17/082* (2006.01)
(Continued)

(52) U.S. Cl.
CPC .............. *H03K 17/56* (2013.01); *H02H 3/08* (2013.01); *H03K 17/0828* (2013.01); *H03K 17/163* (2013.01); *H03K 17/168* (2013.01)

(58) Field of Classification Search
CPC .............. H03K 17/163; H03K 17/168; H03K 17/0828; H03K 17/56; H02H 3/08
(Continued)

(56) References Cited

U.S. PATENT DOCUMENTS 6,288,501 B1 * 9/2001 Nakamura ......... H05B 41/2886
                                                    315/307
6,459,324 B1   10/2002 Neacsu et al.
(Continued)

FOREIGN PATENT DOCUMENTS

EP    1988632 A1    11/2008
JP    H06-291631 A  10/1994
(Continued)

OTHER PUBLICATIONS

PRC (China) Application No. 201580037171.4—Chinese Office Action and Search Report with English Translation, dated Mar. 23, 2020, 11 pages.
(Continued)

*Primary Examiner* — Kevin J Comber
(74) *Attorney, Agent, or Firm* — Christensen O'Connor Johnson Kindness PLLC

(57) ABSTRACT

A turn-off circuit for a semiconductor switch includes an element having a variable resistance coupled to a control input of the semiconductor switch, a circuit for generating a control-input reference signal, and a control circuit coupled to adjust a resistance of the element having a variable resistance in response to the control-input reference signal in a closed control loop in order to turn off the semiconductor switch.

17 Claims, 8 Drawing Sheets

Related U.S. Application Data continuation of application No. 14/744,862, filed on Jun. 19, 2015, now Pat. No. 9,825,625.

(60) Provisional application No. 62/022,304, filed on Jul. 9, 2014.

(51) Int. Cl.
*H03K 17/16* (2006.01)
*H02H 3/08* (2006.01)

(58) Field of Classification Search
USPC .......................................................... 361/101
See application file for complete search history.

(56) References Cited

U.S. PATENT DOCUMENTS

| | | | |
|---|---|---|---|
| 7,061,301 B2 | 6/2006 | Pham | |
| 7,276,954 B2* | 10/2007 | Otoshi | H03K 17/6871 327/108 |
| 7,821,319 B2* | 10/2010 | Thiele | H03K 17/04123 327/427 |
| 8,085,007 B2 | 12/2011 | Sakimura et al. | |
| 8,717,068 B2* | 5/2014 | Wasekura | H02M 1/08 327/108 |
| 2003/0180997 A1 | 9/2003 | Nakayama et al. | |
| 2008/0030256 A1 | 2/2008 | Thiele | |
| 2008/0266727 A1* | 10/2008 | Merilinna | H02M 1/08 361/18 |
| 2010/0141326 A1 | 6/2010 | Tumminaro et al. | |
| 2010/0176783 A1 | 7/2010 | Tagome | |
| 2012/0249020 A1* | 10/2012 | Komatsu | H02M 1/32 327/109 |
| 2017/0214313 A1* | 7/2017 | Kikuchi | H03K 17/08 |

FOREIGN PATENT DOCUMENTS

| | | |
|---|---|---|
| JP | 2001-197724 A | 7/2001 |
| JP | 2009-225506 A | 10/2009 |
| JP | 2011-200037 A | 10/2011 |
| JP | 2012-016110 A | 1/2012 |
| KR | 10-0171713 B | 5/1999 |
| WO | 2006/052667 A2 | 5/2006 |

OTHER PUBLICATIONS

Japanese Patent Application No. 2016-558712—Office Action and English Translation dated Apr. 15, 2019, 12 pages.
Chinese Patent Application No. 201580037171.4—Chinese Office Action and Search Report with English Translation dated Apr. 1, 2019, 11 pages.
European Patent Application No. 18199097.9—Extended European Search Report and Written Opinion, dated Jan. 30, 2019, 10 pages.
International Application No. PCT/EP2015/065712—PCT International Search Report and Written Opinion, dated Sep. 11, 2015, 14 pages.
Musumeci et al., "Switching-Behavior Improvement of Insulated Gate-Controlled Devices," IEEE Transactions on Power Electronics, vol. 12, No. 4, Jul. 1997, 9 pages.
Notice of Reasons for Refusal, dated Apr. 13, 2021, issued in corresponding Japanese application No. 2020-026730, filed Feb. 20, 2020, 10 pages.
Notification of Reason for Refusal, dated May 25, 2021, issued in corresponding Korean application No. 10-2016-7029690, filed Oct. 24, 2016, 14 pages.

\* cited by examiner

MULTI-STAGE GATE TURN-OFF WITH DYNAMIC TIMING

CROSS-REFERENCE TO RELATED APPLICATION

This application is a continuation of U.S. patent application Ser. No. 15/785,816 filed on Oct. 17, 2017, which is a continuation of U.S. application Ser. No. 14/744,862 (U.S. Pat. No. 9,825,625), filed Jun. 19, 2015, which claims the benefit of U.S. Provisional Application No. 62/022,304, filed Jul. 9, 2014, entitled "MULTI-STAGE GATE TURN-OFF WITH DYNAMIC TIMING." U.S. application Ser. No. 15/785,816, U.S. patent application Ser. No. 14/744,862, and U.S. Patent Application No. 62/022,304 are hereby incorporated by reference.

TECHNICAL FIELD

The present invention relates to turn-off circuits for a semiconductor switch, systems comprising a turn-off circuit for a semiconductor switch and an active clamping circuit and methods for turning off a semiconductor switch.

BACKGROUND

Several methods are known for turning off a semiconductor switch (and in particular a power semiconductor switch) in the event of a short-circuit state and/or overcurrent state. In one example, a control input (for example a gate terminal) of the semiconductor switch can be coupled to a first and second resistance, wherein the first resistance is arranged so as to couple the control input of the semiconductor switch, during normal operation, to a reference potential (for example an emitter voltage of the semiconductor switch) and thus to turn off the semiconductor switch. In the event of a short circuit and/or an overcurrent event, a second, greater resistance can now be coupled between the control input of the semiconductor switch and the reference potential. As a result, a current with which the control input of the semiconductor switch is discharged with is reduced. The voltage at the control input of the semiconductor switch is reduced less quickly than during normal operation. It is thus possible to prevent an excessively abrupt turn-off operation which may result in a hazardous overvoltage condition in the semiconductor switch determined by parasitic inductances across a load at the output of the semiconductor switch.

SUMMARY OF THE INVENTION

A first turn-off circuit for a semiconductor switch comprises an element having a variable resistance, said element being coupled to a control input of the semiconductor switch, a circuit for generating a control-input reference signal, and a control circuit, which is designed to adjust a resistance of the element having a variable resistance in response to the control-input reference signal in a closed control loop in order to turn off the semiconductor switch.

An adjustment of the element having a variable resistance in a closed control loop makes it possible to provide a dynamic turn-off circuit which achieves satisfactory results with various different semiconductor switches. Since a current through the control input of the semiconductor switch (for example through the gate input) can be adjusted via the adjusted resistance of the element having a variable resistance, it is possible for the turn-off circuit to be matched dynamically to the respective semiconductor switch. In some turn-off circuits from the prior references, different components need to be used for different semiconductor switches in order to ensure a satisfactory profile of the control input voltage. For example, it can be indicated in the above example to use resistances of different sizes for different types of semiconductor switches. If this matching does not occur, it may arise that a short-circuit state lasts for longer (if the resistance is higher than is necessary) or the voltage across a load at the output of the semiconductor switch is not reduced to the sufficient extent. Other more complex turn-off circuits require a higher number of and/or expensive components.

A second turn-off circuit for a semiconductor switch comprises an element having a variable resistance, said element being coupled to a control input of the semiconductor switch, a detection circuit, which is designed to detect an end of a Miller plateau in a control input voltage or in a corresponding control input current of the semiconductor switch, and a control circuit, which is designed to control a resistance value of the element having a variable resistance in such a way that a voltage which is present at the control input of the semiconductor switch is reduced after the end of a Miller plateau at a predetermined rate.

By coupling a turn-off profile of the semiconductor switch to the detection of an end of a Miller plateau, the second turn-off circuit can likewise be matched dynamically to different semiconductor switches. The Miller plateau (i.e. a region in which substantially the total current through the control input contributes to the charging of a parasitic capacitance between the control input and the drain, collector or anode input of the semiconductor switch so that a voltage between the control input of the semiconductor switch and a source, emitter or cathode input of the semiconductor switch remains substantially constant) can be within a similar voltage range for different semiconductor switches (in many cases even for a wide range of temperature and process parameters). For example, the Miller plateau can be between 9.5 volts and 11.5 volts in many IGBTs. Furthermore, an end of the Miller plateau can indicate a time at which a drain, collector or anode current of a semiconductor switch is reduced to a safe level in the event of a short circuit and/or an overcurrent and, on the other hand, continuance of the turn-off operation may not result in high overvoltages across an output of the semiconductor switch. Thus, an advantageous, dynamic switching point for a change in a turn-off characteristic of a semiconductor switch can be selected.

In a first embodiment, a turn-off circuit for a semiconductor switch includes an element having a variable resistance, said element being coupled to a control input of the semiconductor switch, a circuit for generating a control-input reference signal, and a control circuit, which is designed to adjust a resistance of the element having a variable resistance in response to the control-input reference signal in a closed control loop in order to turn off the semiconductor switch.

This turn-off circuit can have one or more of the following features. For example, the element having a variable resistance is a semiconductor switch. In a further example, the element having a variable resistance is a MOSFET semiconductor switch the element having a variable resistance is a MOSFET semiconductor switch. Also, a variable resistance of the element having a variable resistance is formed between a drain, anode or collector terminal and a source, cathode or emitter terminal of the semiconductor switch. Further, the element having a variable resistance is coupled in series with a further resistance between the control input of the semiconductor switch and a reference potential. For example, the control-input reference signal has a first drop at a first rate, a region with a substantially constant signal level, and a second drop at a second rate. As another example, the second rate is higher than the first rate. Further, the first and second rates are temporally variable. In a further example, the turn-off circuit further includes a detection circuit which is designed to detect an end of a Miller plateau in a control input voltage or in a control input current of the semiconductor switch, wherein the circuit for generating a control-input reference signal is designed to reduce a level of the control-input reference signal in response to a detection of an end of a Miller plateau at a predetermined rate. Also, an end of a Miller plateau is detected on the basis of a voltage at the control input of the element having a variable resistance. Further, an end of a Miller plateau is detected when the voltage at the control input of the element having a variable resistance falls below a determined signal level. For example, the predetermined signal level is in a range of from 50% to 150% of an expected gate threshold voltage of the element having a variable resistance. In another example, the predetermined signal level is in a range of between 0.3 and 2 volts. Also, the predetermined signal level is determined by means of a reference current and by means of a second element based on the same technology as the element having a variable resistance. In some cases, an area or a gate width of the second element is K times an area or a gate width of the element having a variable resistance, and wherein the reference current is selected such that it is K times a threshold value of the output current of the element having a variable resistance which is designed for the end of the Miller plateau. For example, the reference current is coupled to the control input, in particular to the gate of the second element having a variable resistance and to the output, in particular to the drain, of the second element having a variable resistance. Also, the reference current is selected to be less than 100 microamperes and K is selected to be less than 1%. In some cases, the level of the control-input reference signal prior to an end of a Miller plateau being reached is substantially constant, and, in response to the detection of the end of the Miller plateau, the signal level of the control-input reference signal is reduced at the predetermined rate. Further, the turn-off circuit furthermore comprises a circuit for detecting a voltage at the control input of the semiconductor switch. As in another example, the control circuit is designed to adjust the resistance of the element having a variable resistance in response to the control-input reference signal and the voltage at the control input of the semiconductor switch. Also, the control circuit comprises a first comparison circuit in order to compare the control-input reference signal with the voltage at the control input of the semiconductor switch. For example a circuit for generating a control signal for the element having a variable resistance in response to an output of the first comparison circuit. For example, the circuit for generating a control signal comprises a second comparison circuit, which is designed to generate the control signal for the element having a variable resistance in response to a comparison of the output of the first comparison circuit with a fault signal, which indicates a fault state of the semiconductor switch. Also, the turn-off circuit is designed to receive a fault signal, which indicates a fault state of the semiconductor switch. Further, the fault state of the semiconductor switch is a short-circuit state and/or an overcurrent state. In another example, the semiconductor switch is a power semiconductor switch. As a further example, the power semiconductor switch is an IGBT, an IEGT, a power MOSFET or a power bipolar transistor. In some cases, the turn-off circuit furthermore comprises an active clamping circuit. For example, an end of a Miller plateau is detected on the basis of a voltage across the element having a variable resistance. Also, an end of a Miller plateau is detected on the basis of a current at the control input of the semiconductor switch. Further, an end of a Miller plateau is detected on the basis of a voltage across the semiconductor switch. In some cases, an end of a Miller plateau is detected on the basis of a useful current through the semiconductor switch. For example, the control circuit is designed to detect the resistance of the element having a variable resistance on the basis of the control-input reference signal and the voltage across the element having a variable resistance, the current at the control input of the semiconductor switch, the voltage across the semiconductor switch or the useful current through the semiconductor switch. In another example, the circuit for generating a control-input reference signal comprises two or more current sources and a capacitance, wherein the capacitance is arranged so as to be discharged from the two or more current sources in the event of a fault. Also, the capacitance is coupled to a predetermined voltage after a turn-on operation of the semiconductor switch. Further, a first of the two or more current sources is designed to discharge the capacitance after a time at which an end of a Miller plateau has been detected. In some cases, a second of the two or more current sources is designed to discharge the capacitance up to a time at which a threshold voltage is present across the capacitance. For example, the turn-off circuit furthermore comprises a deactivation circuit, which, in response to a deactivation signal, prevents the control circuit from adjusting a resistance of the element having a variable resistance in response to the control-input reference signal.

In a second embodiment, a turn-off system includes one of the turn-off circuits of the first embodiment and the one or more features of the turn-off circuit, an active clamping circuit, which is designed to actively increase an output voltage of a driver circuit of the semiconductor switch to the extent that is necessary in order to keep an output voltage of the semiconductor switch below a determined threshold voltage, and a selection circuit, which, in response to a selection signal, activates either the turn-off circuit or the active clamping circuit in order to turn off the semiconductor switch in the event of a fault.

The turn-off system can have one or more of the following features. For example, an output of the active clamping circuit is coupled to a control input of the element having a variable resistance. Also, the active clamping circuit reduces a voltage at the control input of the element having a variable resistance when a voltage between the control input of the element having a variable resistance and a source, collector or cathode input of the semiconductor switch approaches a predetermined threshold voltage. Further, the turn-off system is designed in such a way that coupling of the control-input reference signal to the control input of the element having a variable resistance is prevented when the active clamping circuit is activated.

In a third embodiment, a turn-off circuit for a semiconductor switch includes an element having a variable resistance, said element being coupled to a control input of the semiconductor switch, a detection circuit, which is designed to detect an end of a Miller plateau in a control input voltage or in a control input current of the semiconductor switch, and a control circuit, which is designed to control a resistance value of the element having a variable resistance in such a way that a voltage which is present at the control input of the semiconductor switch is reduced after the end of a Miller plateau at a predetermined rate.

The turn-off circuit can have one or more of the following features. For example, an end of a Miller plateau is detected on the basis of a voltage at the control input of the element having a variable resistance. In some cases, an end of a Miller plateau is detected when the voltage at the control input of the element having a variable resistance falls below a determined signal level. Also, the predetermined signal level is in a range of from 50% to 150% of an expected gate threshold voltage of the element having a variable resistance. Further, the predetermined signal level is between 0.3 and 2 volts. For example, the level of the control-input reference signal prior to an end of a Miller plateau being reached is substantially constant, and, in response to the detection of the end of the Miller plateau, the signal level of the control-input reference signal is reduced.

In a fourth embodiment, a method for turning off a semiconductor switch includes generating a control-input reference signal and adjusting a resistance of an element having a variable resistance, said element being coupled to a control input of the semiconductor switch, in response to the control-input reference signal in a closed control loop.

In a fifth embodiment, a driver circuit to for use in a switch controller to control a power switch includes an on-state driver coupled to receive an on signal, wherein the on-state driver outputs a first control signal to turn ON the power switch in response to the on signal and the first control signal is substantially equal to a high threshold, an off-state driver coupled to receive an off signal, wherein the off-state driver outputs the first control signal to turn OFF the power switch in response to the off signal and the first control signal is substantially equal to a low threshold, and a soft shutdown circuit, coupled to receive the first control signal, wherein the soft shutdown circuit regulates the first control signal in a closed loop in response to a fault condition, wherein the soft shutdown circuit decreases the first control signal to a mid-threshold from the high threshold for a period of time and then decreases the first control signal to the low threshold, wherein the period of time ends in response to the end of a Miller plateau of the power switch.

The driver circuit can have one or more of the following features. For example, the soft shutdown circuit detects the end of the Miller plateau of the power switch when the off signal reaches a first threshold. In another example, the off-state driver further includes a transistor, wherein the soft shutdown circuit is coupled to receive a gate signal representative of a gate current or a gate voltage of the transistor and detects the end of the Miller plateau of the power switch when the gate signal of the transistor reaches a first threshold. Also, the end of the Miller plateau of the power switch is detected when the gate signal of the transistor reaches a first threshold after a blanking time. Further, the shutdown circuit includes an amplifier coupled to receive the first control signal and a reference signal, wherein the reference signal decreases to the mid threshold from the high threshold for a period of time and then decreases to the low threshold in response to the fault condition and the end of the Miller plateau of the power switch. In some cases, the end of the Miller plateau of the power switch is detected when the gate signal of the transistor reaches a first threshold after a blanking time, wherein the blanking time may be end when the reference signal is substantially equal to the mid threshold. For example, the reference signal is not substantially equal to the mid threshold for the period of time if there is no fault condition. As another example, the driver circuit may receive an active clamping signal, wherein the soft shutdown circuit is disabled when the active clamping signal is between a first threshold and a second threshold. The active clamping signal includes an additional current prior to the first control signal turning OFF the power switch. Further, the fault condition may be an overcurrent condition for the power switch.

In a sixth embodiment, a circuit for turning off a power semiconductor switch includes a turn-off transistor coupled to switch a signal for turning off the power semiconductor switch onto a control terminal of the power semiconductor switch and a feedback control loop for controlling a voltage on the control terminal of the power semiconductor switch during turn-off, the feedback control loop. The feedback control loop includes a feedback path to feedback a measurement of the voltage of the control terminal of the power semiconductor switch, a control terminal reference voltage generator to generate a time-dependent reference voltage, an error amplifier to generate an error signal representative of a difference between the voltage of the control terminal and the time-dependent reference voltage and a forward path to convey the error signal forward for controlling the switching of the signal for turning off the power semiconductor switch onto the control terminal of the power semiconductor switch by the turn-off transistor.

The circuit can have one or more of the following features. For example, the circuit further includes Miller plateau detection circuitry coupled to detect that the voltage of control terminal of the power semiconductor switch is below a voltage level in a vicinity of the Miller plateau of the power semiconductor switch and output a signal indicative thereof. As another example, the control terminal reference voltage generator is to increase a time rate of change of the time-dependent reference voltage in response to the signal indicative that the control terminal of the power semiconductor switch is below the voltage level in the vicinity of the Miller plateau. In some cases, the Miller plateau detection circuitry comprises control terminal current detection circuitry coupled to detect current flow to the control terminal of the power semiconductor switch. Also, the Miller plateau detection circuitry comprises a voltage comparator coupled to compare the control terminal of the power semiconductor switch with a reference voltage. Further, the control terminal reference voltage generator includes first circuitry to change the time-dependent reference voltage from a first value at which the power semiconductor switch is on to a second value in the vicinity of the Miller plateau of the power semiconductor switch and second circuitry to change the time-dependent reference voltage from a third value in the vicinity of the Miller voltage of the power semiconductor switch to a fourth value at which the power semiconductor switch is off. For example, the first circuitry is to change the time-dependent reference voltage at a time rate of change that is less than a time rate of change at which the second circuitry to change the reference voltage. As another example, the first circuitry is to change the time-dependent reference voltage from the first value to the second value in between 400 nanoseconds and 4000 nanoseconds. In some cases, the second circuitry is to change the time-dependent reference voltage from the third value to the fourth value in between 100 nanoseconds and 2000 nanoseconds. In another example, the second circuitry is to change the time-dependent reference voltage from the third value to the fourth value in between 10 nanoseconds and 100 nanoseconds. Also, the second value is above the Miller plateau of the power semiconductor switch and the third value is below the Miller plateau of the power semiconductor switch. Further, the control terminal reference voltage generator comprises circuitry to hold the time-dependent reference voltage constant between the second value and the third value. For some examples, fault detection circuitry coupled to output a fault signal in response to detection of a fault in current conduction through the power semiconductor switch, wherein the control terminal reference voltage generator is responsive to the fault signal to begin changing the reference voltage from a value at which the power semiconductor switch is open. As another example, the fault detection circuitry comprises circuitry for detecting a collector-to-emitter voltage of the power semiconductor switch. Also, the signal for turning off the power semiconductor switch is a current and the circuit further comprises a turn-off gate resistor. Further, the power semiconductor switch is an IGBT. In some cases, the turn-off transistor is an NMOS transistor.

BRIEF DESCRIPTION OF THE FIGURES

Non-limiting and non-exhaustive exemplary embodiments of the invention are described with reference to the following figures, wherein the same reference symbols relate to the same components in different figures, where not specified otherwise.

DETAILED DESCRIPTION

Numerous details are given in the description below to enable a far-reaching understanding of the present invention. However, it is clear to a person skilled in the art that the specific details are not necessary for implementing the present invention. Known apparatuses and methods are not outlined in detail at another point in order to not unnecessarily hinder understanding of the present invention.

In the present description, a reference to "an implementation", "a configuration", "an example" or "example" means that a specific feature, structure or property which is described in conjunction with this embodiment is included in at least one embodiment of the present invention. Thus, the phrases "in one implementation", "in one embodiment", "one example" or "in one example" at different points in this description do not necessarily all relate to the same embodiment or the same example.

In addition, the specific features, structures or properties can be combined in any desired suitable combinations and/or subcombinations in one or more embodiments or examples. Particular features, structures or properties can be included in an integrated circuit, in an electronic circuit, in circuit logic or in other suitable components which provide the described functionality. Furthermore, reference will be made to the fact that the drawings are used for explanatory purposes for a person skilled in the art and that the drawings are not necessarily illustrated true to scale.

Figure 1A:
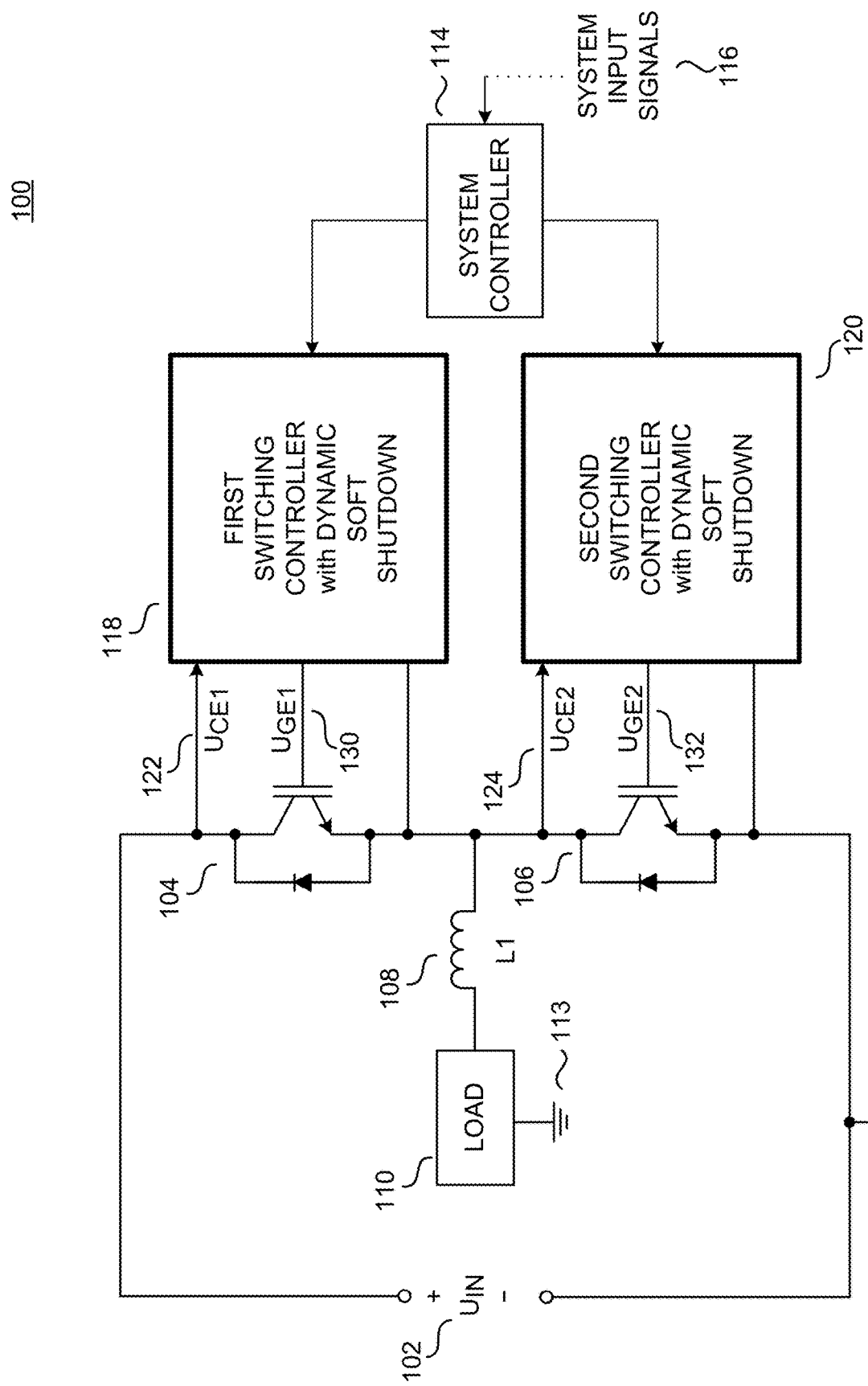
FIG. 1A shows an exemplary apparatus for providing electrical energy to a consumer, said apparatus having a control circuit for semiconductor switches having the turn-off circuits described herein.

FIG. 1A shows an apparatus 100 (also referred to as power converter) for providing electrical energy to a consumer 110, said apparatus having a control circuit for semiconductor switches having the turn-off circuits described herein. However, the flow of energy can also point in the other direction. In this case, the element 110 is a generating unit. In the other apparatuses, element 110 can operate in different operating states, both as a consumer and as a generating unit. In the following text, only an apparatus for providing energy is discussed, which includes all of the just mentioned cases (the energy can be provided at different outputs). The apparatus comprises two power semiconductor switches 104, 106, which are coupled together. In addition, the apparatus 100 can receive a DC input voltage 102 (UIN). The apparatus is designed to transmit electrical energy, by controlling the power semiconductor switches 104, 106, from the input to an output, to which the consumer 110 is connected (or in the reverse direction). In this case, the apparatus for providing electrical energy can control voltage levels, current levels or a combination of the two variables, which are output to the consumer. In the example shown in FIG. 1A, the power semiconductor switches 104, 106 are IGBTs.

In the text which follows, the apparatuses and methods are explained using the example of IGBTs. However, the turn-off apparatuses described herein are not restricted to use with IGBTs. Instead, they can also be used in combination with other power semiconductor switches. For example, metal-oxide semiconductor field-effect transistors (MOSFETs), bipolar transistors (BJTs), injection-enhancement gate transistors (IEGTs) and gate turn-off thyristors (GTOs) can be used with the turn-off apparatuses described herein. The turn-off apparatuses described herein can also be used with power semiconductor switches which are based on gallium nitride (GaN) semiconductors or silicon carbide (SiC) semiconductors.

A maximum nominal collector-emitter, anode-cathode or drain-source voltage of a power semiconductor switch in the switched-off state can be more than 500 V, preferably more than 2 kV.

In addition, the turn-off apparatuses described herein are not restricted to use with power semiconductor switches. Thus, other semiconductor switches can also be used with the turn-off apparatuses described herein. The effects and advantages which are mentioned here also occur at least partly in systems with other semiconductor switches.

Since IGBTs are discussed below, the terminals of the power semiconductor switch are referred to as "collector", "gate" and, "emitter". As already explained above, the apparatuses and methods are not restricted to IGBTs, however. In order to avoid unnecessarily long descriptions, the designation "emitter" herein also includes the terminal of corresponding power semiconductor switches which are denoted by "source" or "cathode". Equally, the term "collector" herein also includes the terminal denoted by "drain" or "anode", and the term "gate" denotes the terminal of corresponding power semiconductor switches denoted by "base". In the text which follows, the term "collector-emitter voltage" also includes a "drain-source voltage" and a "cathode-anode voltage" and the terms "collector voltage" and "emitter voltage" also include a "drain voltage" or "anode voltage" and a "source voltage" or "cathode voltage", respectively.

The power semiconductor switches 104, 106 are each controlled by a first and second control circuit 118, 120. Said control circuits provide a first and a second gate-emitter driver signal 130, 132 ($U_{GE1}$, $U_{GE2}$) in order to control the switching times of the first and second IGBTs. Both control circuits 118, 120 can optionally in turn be controlled by a system controller 114. The system controller 114 can have an input for receiving system input signals 116. In the example shown in FIG. 1A, two power semiconductor switches 104, 106 with a half-bridge configuration are illustrated. The turn-off apparatuses can also be used in other topologies, however. For example, a single power semiconductor switch (for example a single IGBT) having an apparatus for detection of a profile of a voltage across a power semiconductor switch or of a control circuit can be coupled. In other examples, in a three-phase system having six power semiconductor switches or twelve power semiconductor switches, each of the power semiconductor switches can have an apparatus for detecting a profile of a voltage across a power semiconductor switch.

In addition to the output of a gate-emitter driver signal, the control circuits 118, 120 receive signals which represent voltages which are present across the power semiconductor switches 104, 106. The signals may be voltage signals or current signals. In the example shown in FIG. 1A, each control circuit 118, 120 has in each case one signal, which is representative of the collector-emitter voltage and is denoted as collector-emitter voltage signal 122, 124 ($U_{CE1}$, $U_{CE2}$).

FIG. 1A shows the control circuits 118, 120 as separate control circuits. However, the two control circuits 118, 120 can also be combined in a single circuit. In this case, a single control circuit controls two power semiconductor switches 104, 106. Furthermore, the second gate-emitter driver signal 132 ($U_{GE2}$) can be an inverted first gate-emitter driver signal 130 ($U_{GE1}$).

The two control circuits 118, 120 comprise one of the turn-off apparatuses described herein. In response to the establishment of a short-circuit state and/or overcurrent state, the respective power semiconductor switch 104, 106 can be turned off with the aid of the turn-off apparatuses described herein.

Figure 1B:
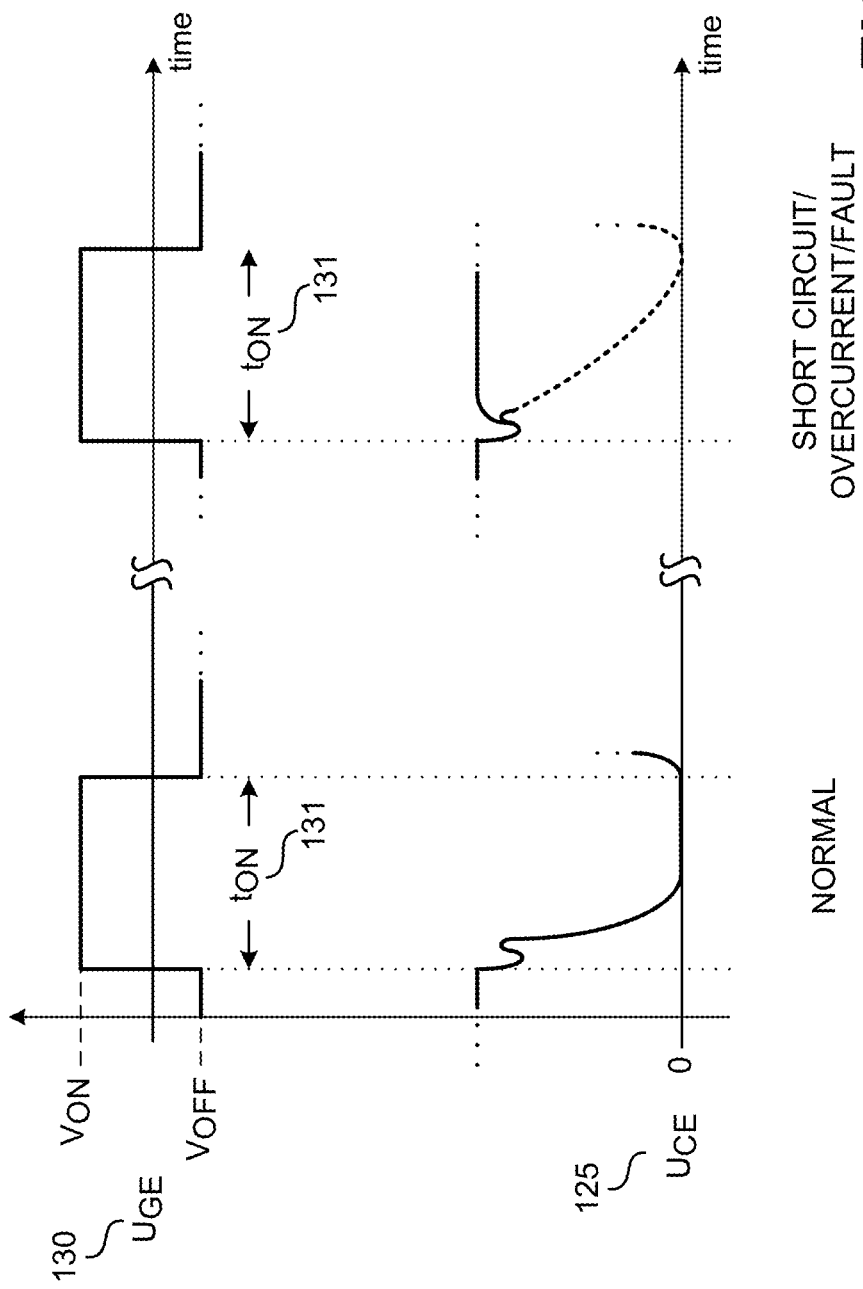
FIG. 1B shows exemplary signal profiles of voltages across a control terminal of a semiconductor switch and signal profiles of a voltage across a semiconductor switch during normal operation or in the event of a short circuit.

FIG. 1B shows exemplary signal profiles of voltages across a control terminal of a semiconductor switch and signal profiles of a voltage across a semiconductor switch during normal operation and in the event of a short circuit. Signal profiles of a voltage 130 ($U_{GE}$) between a gate terminal and an emitter terminal are shown in the upper half of FIG. 1B. The voltage 130 ($U_{GE}$) is shown as have a first signal level ($V_{ON}$) and a second, different signal level ($V_{OFF}$). If the gate terminal is at the first signal level ($V_{ON}$), the semiconductor switch is turned on (for a time $t_{ON}$ 131). Signal profiles of a collector-emitter voltage 125 across the semiconductor switch in the normal case (on the left-hand side) and in an exemplary short-circuit and/or overcurrent case (on the right-hand side) when the semiconductor switch is turned on are shown in the lower half of FIG. 1B. In the short-circuit case shown, the collector-emitter voltage 125 does not decrease rapidly to a relatively low value after turn-on (however, there are still further short-circuit cases in which the collector-emitter voltage assumes other characteristic profiles). This can result in damage in the semiconductor switch and on the load. Therefore, the semiconductor switch should be turned off quickly. However, if this takes place too quickly, overvoltages on the load can occur. In order to prevent this, the turn-off circuits described herein can be used.

Figure 2:
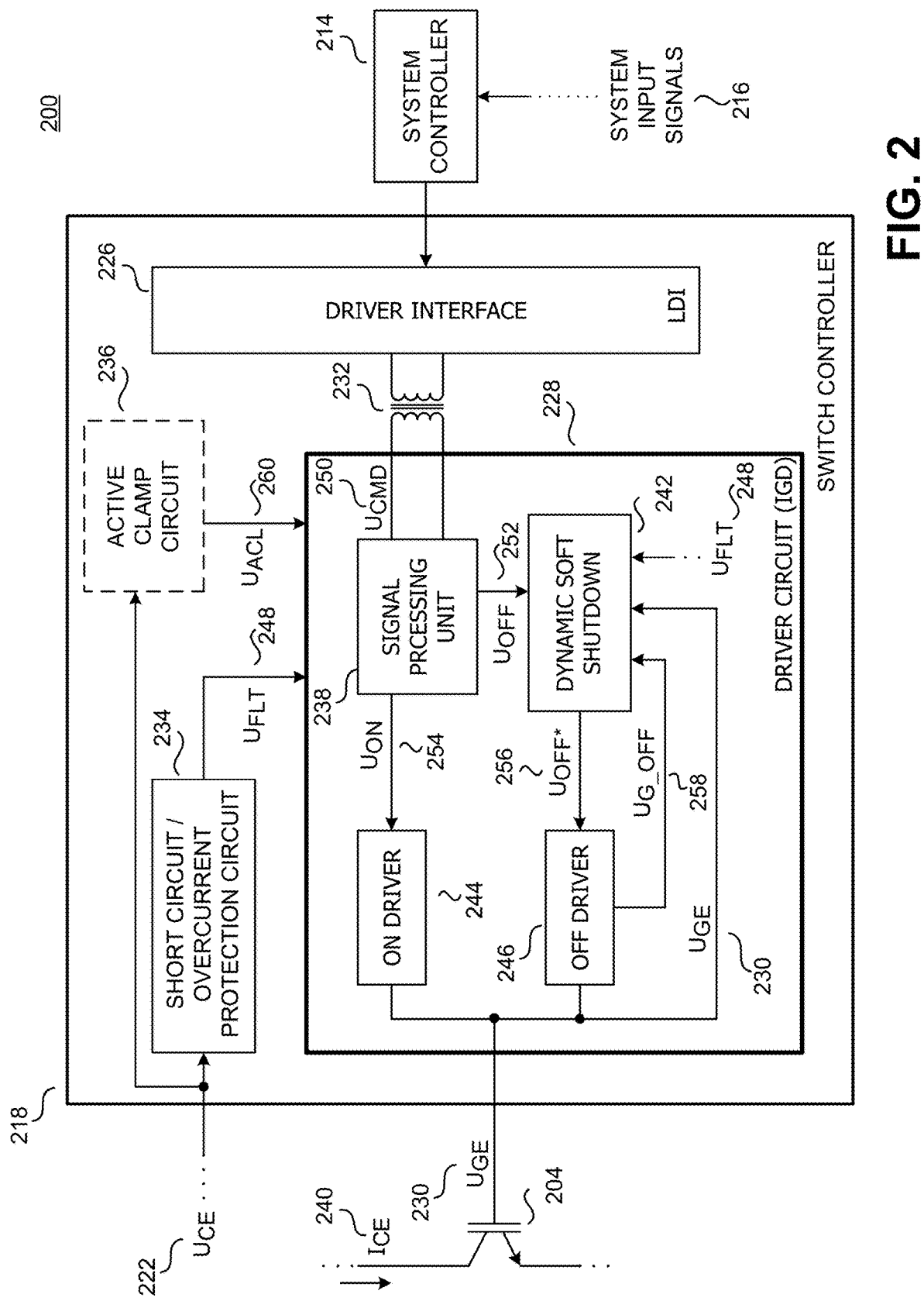
FIG. 2 shows an exemplary control circuit for a semiconductor switch having a turn-off circuit described herein and an active clamping circuit.

FIG. 2 shows an exemplary control circuit 218 for a semiconductor switch comprising a turn-off circuit 242 described herein and an (optional) active clamping circuit 236. The control circuit receives control commands from a system controller 214 (said control commands in turn are generated in response to system input signals 216). At a driver interface 226, these control commands are converted into control signals 250 ($U_{CMD}$), which are transmitted to the driver circuit 228 via an isolating transformer 232. The driver circuit 228 controls a semiconductor switch 204 in response to the control signals 250 ($U_{CMD}$) received via the isolating transformer 232. For this purpose, the driver circuit 228 is coupled to a control input (for example to a gate input) of the semiconductor switch 204.

The exemplary driver circuit 228 shown in FIG. 2 has a driver for the ON state and a driver for the OFF state of the semiconductor switch 244, 246. Said drivers 244, 246 each generate the driver signal 230 ($U_{GE}$) for the semiconductor switch 204. The two drivers 244, 246 are controlled via a driver signal processing unit 238, which receives the control signals 250 ($U_{CMD}$) from the isolating transformer 232 (and converts them into an ON signal 254 ($U_{ON}$) and an OFF signal 258 ($U_{OFF}$) for the respective driver 244, 246).

A turn-off circuit 242 described herein is coupled between the driver signal processing unit 238 and the driver for the OFF state 246. Said turn-off circuit 242 can ensure a turn-off operation in a short-circuit case and/or an overcurrent case, in which during the turn-off operation a drop in the switch current 240 (in this example the collector-emitter current $I_{CE}$) through the semiconductor switch is not as steep as during normal operation (a so-called "soft shutdown"). As a result, it is possible to prevent hazardous overvoltages from arising across the output of the semiconductor switch. Details in respect to the properties of various turn-off circuits are discussed in connection with FIG. 3, FIG. 4 and FIG. 5.

The turn-off circuit 242 receives the OFF signal 252 ($U_{OFF}$) for the driver for the OFF state 246, a fault signal 248, which indicates the presence of a short-circuit case and/or an overcurrent case, and a signal which is present at the control terminal of the semiconductor switch 230 (for example a gate-emitter voltage $U_{GE}$). On the basis of these signals, the turn-off circuit 242 can dynamically control a turn-off operation of the semiconductor switch 204. In one example, a profile of the signal which is present at the control terminal of the semiconductor switch 230 can be adjusted in a closed control loop in order to turn off the semiconductor switch 204. In the example shown in FIG. 2, adjustment can include the generation of a modified OFF signal 256 ($U_{OFF*}$), which is transmitted from the turn-off circuit 242 to the driver for the OFF state 246. This modified OFF signal 256 ($U_{OFF*}$) can, in one example, vary a variable resistance of an element having a variable resistance in the driver for the OFF state 246 and thus influence the profile of the signal which is present at the control terminal of the semiconductor switch 230 (for example a gate-emitter voltage $U_{GE}$). In other words, the modified OFF signal 256 ($U_{OFF*}$) can be a manipulated variable of the control loop. In the example shown in FIG. 2, the signal which is present at the control terminal of the semiconductor switch 230 (for example a gate-emitter voltage $U_{GE}$) is a feedback parameter of the control loop. However, other parameters can also be used as feedback parameters.

In addition or as an alternative, the driver for the OFF state 246 can be controlled in such a way that a voltage which is present at the control input of the semiconductor switch 230 (for example a gate-emitter voltage $U_{GE}$) is reduced after the end of a Miller plateau at a predetermined rate. In this way, the dynamic turn-off circuit 242 can ensure a suitable "soft shutdown" for different semiconductor switches. In one example, an end of the Miller plateau in a control input voltage or in a control input current of the semiconductor switch 204 can be detected on the basis of a profile of a voltage at a control input of an element having a variable resistance 258 ($U_{G\_OFF}$) in the driver for the OFF state 246.

The control circuit 218 includes a short-circuit and/or overvoltage detection circuit 234, which generates the fault signal 248 ($U_{FLT}$). In one example, the short-circuit and/or overvoltage protection circuit 234 can monitor a collector-emitter voltage 222 ($U_{CE}$) of the semiconductor switch 204. As mentioned in connection with FIG. 1B, said collector-emitter voltage 222 ($U_{CE}$) can assume a characteristic profile in a short-circuit case and/or overcurrent case, and the short-circuit and/or overvoltage protection circuit 234 can detect this characteristic profile.

Optionally, the control circuit 218 can comprise an active clamping circuit 236. This can provide a second circuit for a "soft shutdown" in the event of a fault, which circuit can be used as an alternative to the turn-off circuit 242.

Since an exemplary control circuit for a semiconductor switch having a turn-off circuit 242 described herein and an active clamping circuit 236 have been discussed with respect to FIG. 2, an exemplary turn-off circuit will be explained with respect to FIG. 3.

Figure 3:
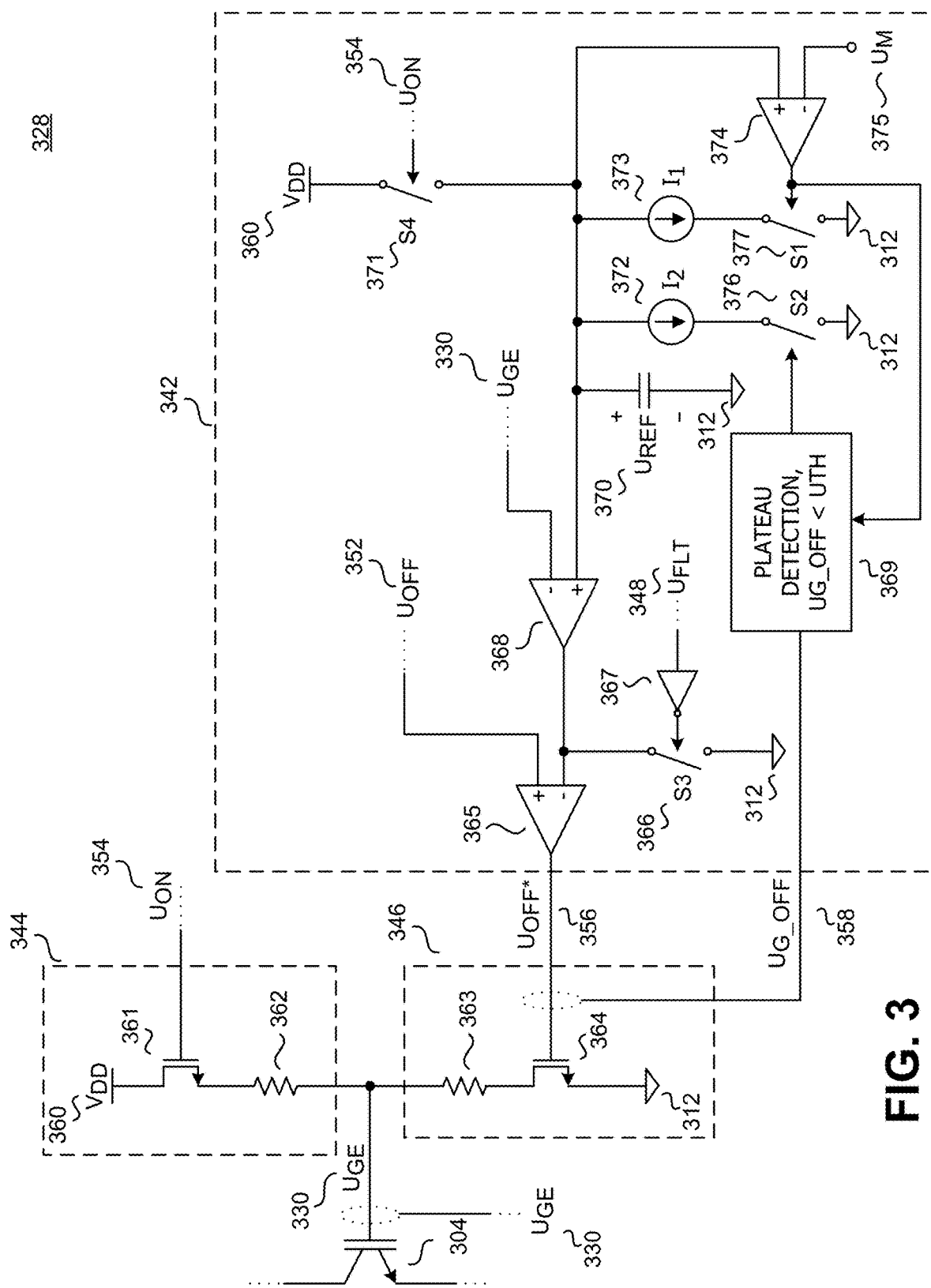
FIG. 3 shows an exemplary turn-off circuit.

FIG. 3 shows a driver for the ON state 344, a driver for the OFF state 346, a turn-off circuit 342 and a semiconductor switch 304. The drivers 344, 346 each include an element having a variable resistance 361, 364 (in the example shown in FIG. 3 as an NMOS semiconductor switch, but other switchable semiconductor switches or other elements having a variable resistance can also be used). The elements having a variable resistance 361, 364 are each coupled in series with the optional resistances 362, 363.

The element having a variable resistance 361 (and the resistance 362) of the driver for the ON state 344 are coupled between a control input of the semiconductor switch 304 (the gate input in the example shown in FIG. 3) and a first reference potential 360 ($V_{DD}$). In addition, the element having a variable resistance 361 is arranged in such a way that it can receive an ON signal 354 ($U_{ON}$) of the control circuit at a control terminal of the element having a variable resistance 361 (for example at a gate input of the NMOS 361). If, therefore, the semiconductor switch is intended to be turned on, a resistance of the element having a variable resistance 361 is reduced (for example the NMOS semiconductor switch 361 is turned on) so that the control input of the semiconductor switch 304 (for example gate terminal of the IGBT 304) is coupled to a potential which is high enough to turn on the semiconductor switch (for example the first reference potential 360 $V_{DD}$ in FIG. 3).

Similarly, the element having a variable resistance 364 (and the resistance 363) of the driver for the OFF state 346 are coupled between a control input of the semiconductor switch 304 (the gate input of the IGBT in the example shown in FIG. 3) and a second reference potential 312. In addition, the element having a variable resistance 364 is arranged in such a way that it can receive a modified OFF signal 356 ($U_{OFF^*}$) of the control circuit at a control terminal 364 (shown as the gate terminal of the NMOS 364). If, therefore, the semiconductor switch 304 is intended to be switched off, a resistance of the element having a variable resistance 364 is reduced (for example the NMOS semiconductor switch 364 is turned on) such that the control input of the semiconductor switch 304 (gate terminal of the IGBT 304) is coupled to a potential which is low enough for the semiconductor switch to be switched off (for example the second reference potential 312). The switching off of the semiconductor switch 304 by pulling the control terminal (gate terminal of the IGBT) immediately to the second reference potential results in relatively rapid decrease in the collector-emitter current of the semiconductor switch 304. If, however, a short-circuit case is present, the rapid decrease in the collector-emitter current as a result of parasitic couplings could result in the generation of possibly hazardous overvoltages. In order to prevent the influence thereof, the turn-off circuit 342 can be used in a short-circuit case and/or overcurrent case to implement soft shutdown.

In the example shown in FIG. 3, a switch 366 (S3) is controlled by a fault signal 348 ($U_{FLT}$) in such a way that the switch 366 (S3) is open when there is a fault (for example when a corresponding detection circuit has identified a fault). As a result, an (original) OFF signal 352 ($U_{OFF}$) is modified by the turn-off circuit 342 in the case of a fault. During normal operation, on the other hand, the switch S3 366 is closed and is coupled to a fixed reference potential 312 so that the turn-off circuit 342 does not influence the element having a variable resistance 364 of the driver for the OFF state 346.

The turn-off circuit 342 includes a circuit for generating a control-input reference signal 370 ($U_{REF}$), a detection circuit 369, which is designed to detect an end of a Miller plateau in a control input voltage or in a corresponding control input current of the semiconductor switch and a first comparison circuit 368 in order to compare the control-input reference signal 370 ($U_{REF}$) with the voltage at the control input of the semiconductor switch 330 ($U_{GE}$).

First, the circuit for generating a control-input reference signal 370 ($U_{REF}$) is explained. Said circuit includes a capacitance, wherein the reference signal 370 ($U_{REF}$) is formed by a voltage across the capacitance. In the example shown in FIG. 3, the capacitance may be coupled to two current sources 372, 373 ($I_1$, $I_2$) and can be discharged through current sources 372, 373 ($I_1$, $I_2$) in order to reduce a signal level of the reference signal 370 ($U_{REF}$) at a first or second rate. The first and second rate may be proportional to the value of the current sources 372, 373 ($I_1$, $I_2$) and the capacitance. First, a first terminal of the capacitance can be coupled to a determined reference potential 360 ($V_{DD}$) once the semiconductor switch 304 has been turned on in response to the ON signal 354 ($U_{ON}$). This corresponds to the first reference potential 360 to which the control input of the semiconductor switch 304 is coupled to in the ON state, in the example shown in FIG. 3. Since a second terminal of the capacitance is at a lower potential (this corresponds to the second reference potential 312 to which the control input of the semiconductor switch 304 is coupled to in the OFF state, in the example shown in FIG. 3), the capacitance is charged to the determined voltage during the ON state of the semiconductor switch 304 and consequently still just prior to the beginning of the turn-on. As a result, the control-input reference signal 370 ($U_{REF}$) "starts" at a predetermined signal level, which corresponds to the determined reference potential 360 ($V_{DD}$).

The first current source 373 is coupled to the second reference potential 312 via a switch 377 (S1). When the switch 377 (S1) is closed, the first current source 373 discharges the capacitance at the first rate (corresponding to the current $I_1$). A control circuit for the switch 377 (S1) can be designed in such a way that the switch 377 (S1) is kept closed from a time at which a short-circuit case and/or overcurrent case is detected (or a predetermined time span after the detection of a short-circuit case and/or overcurrent case) up to a time at which a voltage 330 at the control input of the semiconductor switch 304 reaches a voltage which corresponds to a Miller plateau of the semiconductor switch (shown as signal UM 375). Thus, in this time span, the capacitance is discharged at a first rate.

In the example shown in FIG. 3, the control circuit for the switch 377 (S1) includes a comparison circuit 374, which compares a voltage across the capacitance (i.e. the reference signal 370 ($U_{REF}$)) with a threshold value 375 (UM). This threshold value 375 (UM) can be selected in such a way that it reflects a voltage which corresponds to a Miller plateau of the semiconductor switch. For many IGBTs, this voltage can be between 9.5 volts and 11.5 volts. If a signal level of the reference signal 370 ($U_{REF}$) reaches the threshold value 375 (UM), the switch 377 (S1) is opened. The capacitance is now no longer discharged by the current source 373. This can result in the signal level of the reference signal 370 ($U_{REF}$) remaining substantially (for example with a maximum change of 10% of the initial signal level) constant for a determined time period. This time period is ended by the closing of switch 376 (S2), and as such a discharge operation of the capacitance is again initiated by the second current source 372.

This time of the closing of the further switch 376 (S2) can be determined by the detection circuit 369, which is designed to detect an end of a Miller plateau in a control input current or a control input voltage of the semiconductor switch 304. In the example shown in FIG. 3, an end of the Miller plateau is determined on the basis of a voltage at the control input of the element having a variable resistance 364 of the driver for the OFF state 358 ($U_{G\_OFF}$) (for example a gate-voltage of the element having a variable resistance 364). If this voltage falls below a predetermined threshold value UTE, this can indicate an end of a Miller plateau (the coincidence of the end of the Miller plateau with the threshold value being undershot cannot be perfect in this case, but the threshold value being undershot provides a good estimation for the time of the end of the Miller plateau).

Figure 7:
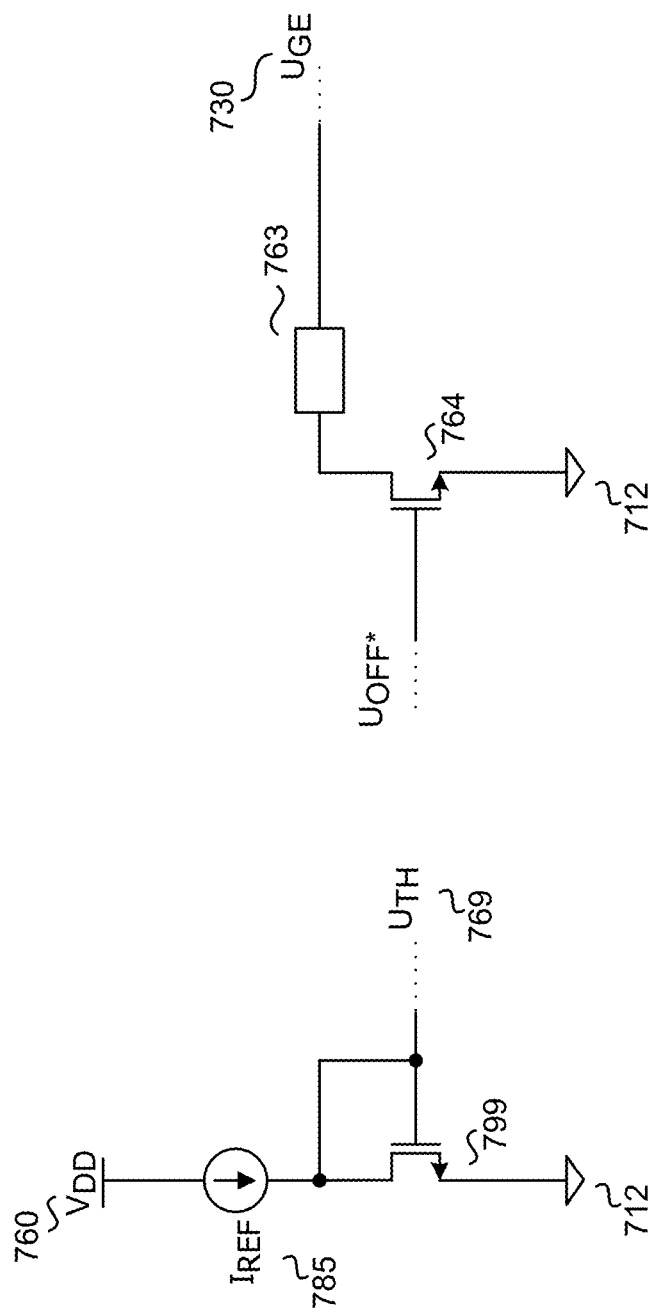
FIG. 7 shows an exemplary circuit for generating a threshold voltage in a circuit for detecting an end of a Miller plateau.

An exemplary circuit for generating the threshold value UTE is shown in FIG. 7. In one example, the threshold value UTE is in a range of from 50% to 150% of an expected gate threshold voltage of the element having a variable resistance 364. In another example, the threshold value UTE can be in a range of between 0.3 and 2 volts. In the example shown in FIG. 7, the circuit for generating the threshold value $U_{TH}$ includes a second element having a variable resistance 799 based on the same technology (an NMOS semiconductor switch in the example shown in FIG. 7) as the element having a variable resistance 764 of the driver for the OFF state. A reference current 785 ($I_{REF}$) can be coupled to a control input of the second element 799 (for example the gate terminal) and to a first terminal (for example the drain terminal) of the second element 799. An area or a gate width of the second element 799 can be K times an area or a gate width of the element having a variable resistance 764 of the driver for the OFF state, wherein the reference current 785 ($I_{REF}$) is selected such that it is K times a threshold value of the output current of the element having a variable resistance 764 which is designed for the end of the Miller plateau. In one example, the reference current 785 ($I_{REF}$) is less than 100 microamperes and K is less than 1%. Given such circuitry, the threshold value UTE can correspond to a voltage at the control input of the second element having a variable resistance 799.

In the example shown in FIG. 3, a voltage at the control input of the element having a variable resistance 364 of the driver for the OFF state 346 (gate voltage of the NMOS 364) can be used for detecting the time at the end of the Miller plateau. However, the time can also be determined on the basis of other signals. In other examples, a current at the control input of the element having a variable resistance 364 of the driver for the OFF state is used in order to determine an end of the Miller plateau. For example, the current at the control input of the element having a variable resistance 364 for the driver for the OFF state 346 can tend towards zero when the end of the Miller plateau is reached. In yet further examples, a control voltage or a control current of the semiconductor switch 304 can be used. In further examples, a collector-emitter voltage of the semiconductor switch or a switch current of the semiconductor switch can be detected in order to detect an end of the Miller plateau.

By closing the switch 376 (S2), the capacitance, starting from the end of the Miller plateau, is discharged at a second rate. This discharge operation can last until the capacitance has been completely discharged (or until the capacitance has been discharged up to a predetermined minimum value). Therefore, the reference signal 370 ($U_{REF}$) can have the profile shown in FIG. 4 with two regions with a falling signal level. The first and second rates can in this case be set as desired. For example, the second rate can be twice as high or higher than the first rate. In other examples, the first and second rates are the same.

The reference signal 370 ($U_{REF}$) generated by the circuit for generating a control-input reference signal shown in FIG. 3 can include two regions with a falling signal level, with a region with a substantially constant signal level being embedded between said regions. This sequence of regions is not essential, however. For example, the first and/or second rate can vary in time. In other examples, the reference signal 370 ($U_{REF}$) can have more than two regions with a falling signal level in which the signal decreases at different rates. Further regions with a substantially constant signal level can be embedded between these regions.

Since the generation of the reference signal 370 ($U_{REF}$) has been discussed in the preceding paragraphs, the use of this reference signal 370 ($U_{REF}$) for achieving a "soft shutdown" will be described below. In this regard, the reference signal 370 ($U_{REF}$) can be compared with a voltage at the control input of the semiconductor switch 330 ($U_{GE}$) by the first comparison circuit 368. In response to this comparison, a modified control signal 356 ($U_{OFF*}$) for the element having a variable resistance 364 of the driver for the OFF state 346 can be generated. In the example shown in FIG. 3, an OFF signal 352 ($U_{OFF}$) is converted into a modified OFF signal 356 ($U_{OFF*}$) for this purpose. This can take place in a subtraction circuit 365.

In this way, the variable resistance of the element having a variable resistance 364 can be adjusted in a closed control loop in order to achieve a profile of the voltage at the control input of the semiconductor switch 330 ($U_{GE}$) which corresponds to the profile of the reference signal 370 ($U_{REF}$). In this way, the semiconductor switch is subjected to "soft shutdown".

In other examples, the feedback variable for the closed control loop can be a different signal than the voltage at the control input of the semiconductor switch 330 ($U_{GE}$), on the basis of which a turn-off operation of the semiconductor switch can be monitored (for example a current at the control input of the semiconductor switch or a collector-emitter voltage of the semiconductor switch). In these cases, it may be necessary to give the reference signal 370 ($U_{REF}$) a different profile than that shown in the example of FIG. 3. In these examples too, however, the manipulated variable of the closed control loop can be a resistance of the element having a variable resistance 364 of the driver for the OFF state 346 (or a control signal which varies the resistance of the element having a variable resistance 364).

Figure 4:
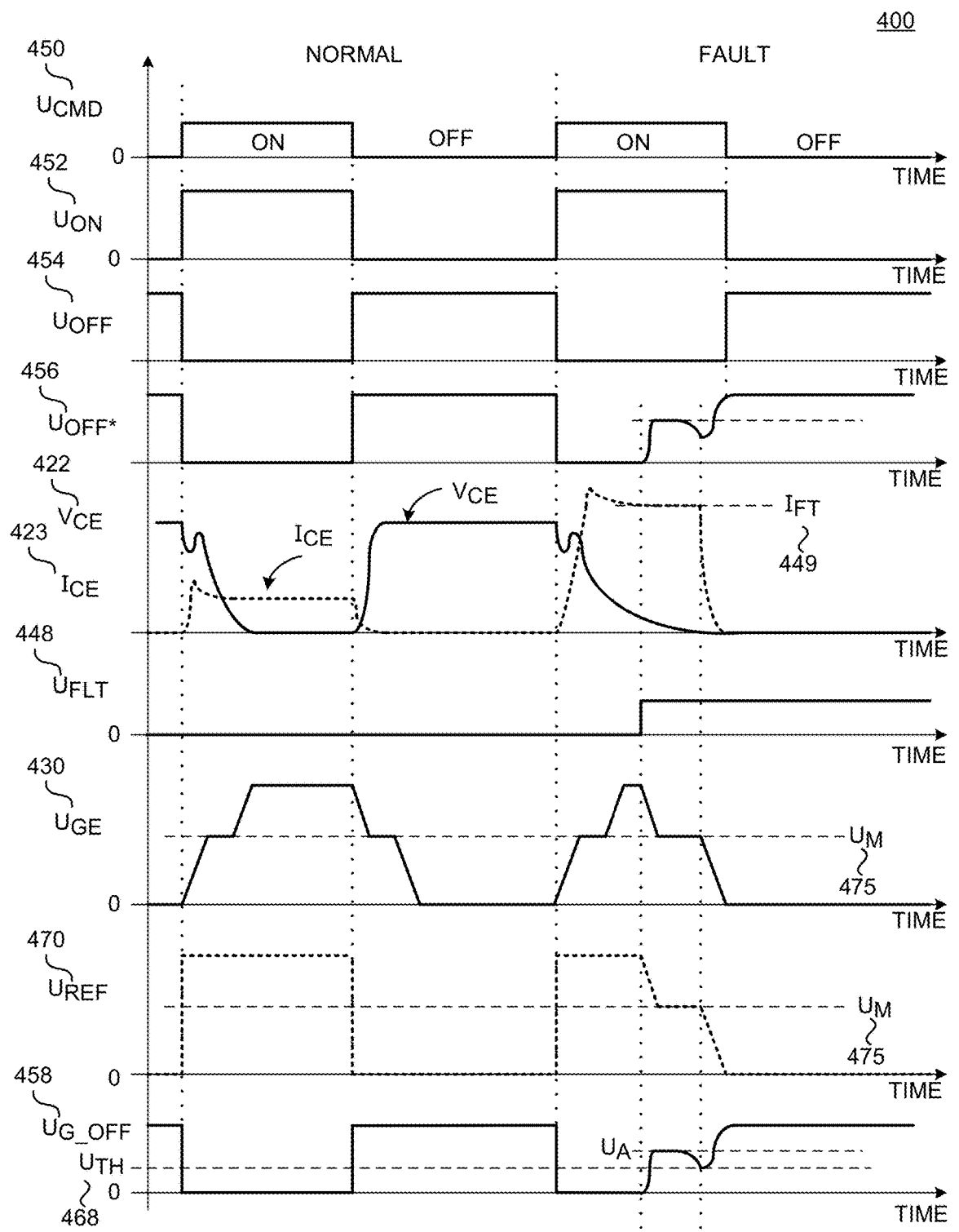
FIG. 4 shows exemplary signal profiles in a system which has a control circuit for semiconductor switches having the turn-off circuits described herein.

FIG. 4 shows exemplary signal profiles in a system which has a control circuit for semiconductor switches having the turn-off circuits described herein. The signals in FIG. 4 show two exemplary switching cycles of the semiconductor switch. The first switching cycle (curves on the left-hand side of the page) has a normal profile, while a short-circuit case or overcurrent case occurs in the second switching cycle (curves on the right-hand side of the page). The first curve shows control signals 450 ($U_{CMD}$), as are transmitted, for example, from a driver interface 226 in FIG. 2 to the control circuit 228. An ON signal 452 ($U_{ON}$) and an OFF signal 454 ($U_{OFF}$) can be generated from these control signals 450 ($U_{CMD}$). The fifth curve shows a profile of a collector-emitter voltage 422 ($V_{CE}$) of the semiconductor switch and a profile of a collector-emitter current 423 ($I_{CE}$) of the semiconductor switch. Some characteristics of these profiles have already been explained with respect to FIG. 1B. At the beginning of the second ON period, a fault occurs. The collector-emitter voltage 422 ($V_{CE}$) does not drop as severely as would be expected in the normal case. In addition, the collector-emitter current 423 ($I_{CE}$) increases to a higher value than in the normal case (an increased fault current 449 ($I_{FT}$) is flowing). This can be detected by a short-circuit and/or overvoltage detection circuit, which thereupon outputs a fault signal 448 ($U_{FLT}$) shown as the sixth curve in FIG. 4. As a result, a turn-off circuit can be activated in order to ensure "soft shutdown".

For this purpose, a control-input reference signal 470 ($U_{REF}$) can be generated. The exemplary reference signal 470 ($U_{REF}$) in FIG. 4 first drops from a predetermined level at a first rate, then remains substantially constant for a time period, which is ended by an end of a Miller plateau of the semiconductor switch. Then the signal level of the reference signal 470 ($U_{REF}$) drops at a second rate. As shown in FIG. 4, the turn-off circuit adjusts a gate-emitter voltage 430 ($U_{GE}$—illustrated as the third curve from the bottom) of the semiconductor switch to the reference signal 470 ($U_{REF}$) when an overcurrent and/or a short circuit is detected. This can have the result that a turn-off operation of the semiconductor switch is extended in comparison with the "hard shutdown" during normal operation. This extension can be identified in FIG. 4 by a comparison of the falling edges of the gate-emitter voltage 430 in the first switching cycle and in the second switching cycle. The delay of the turn-off operation is in this case connected to a detection of an end of the Miller plateau of the semiconductor switch: the semiconductor switch is only ultimately turned off when an end of the Miller plateau has been reached. Thus, hazardously high voltages across the load can be avoided.

The fourth curve in FIG. 4 shows an exemplary OFF signal 456 ($U_{OFF*}$) modified by a turn-off circuit (for example the turn-off circuit shown in FIG. 3). This signal can be fed to a control input of an element having a variable resistance of a driver for the OFF state of the semiconductor switch in order to adjust the turn-off operation of the semiconductor switch. In the example shown in FIG. 4, a rising edge of the modified OFF signal 456 ($U_{OFF*}$) is longer than a rising edge of the OFF signal 454 ($U_{OFF}$). This can result in a turn-on operation of a semiconductor switch in a driver for the OFF state (for example NMOS 364 in FIG. 3) and therefore a turn-off operation of the semiconductor switch (for example IGBT 304 in FIG. 3) being temporally stretched in order to enable a "soft shutdown". The lowermost curve in FIG. 4 shows a detection signal 458 ($U_{G\_OFF}$) for a detection circuit 369 which is designed to detect an end of a Miller plateau in a control input voltage or in a corresponding control input current of the semiconductor switch. The detection signal 458 ($U_{G\_OFF}$) can correspond to the modified OFF signal 456 ($U_{OFF*}$) or be generated on the basis of the modified OFF signal 456 ($U_{OFF*}$).

Figure 6:
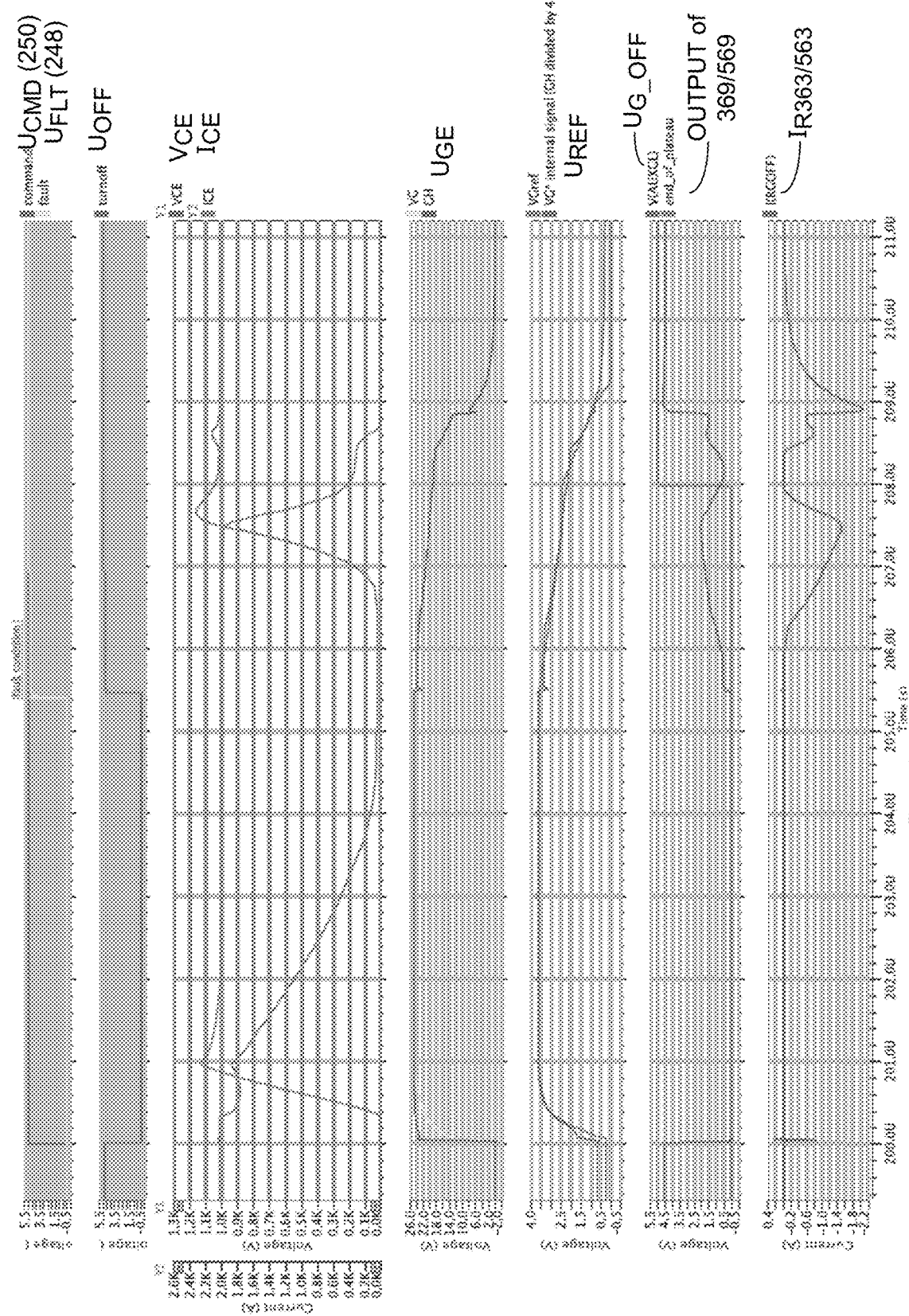
FIG. 6 shows simulated signal profiles in an exemplary turn-off circuit.

FIG. 6 shows simulated signal profiles for a turn-off circuit corresponding to the signals in FIG. 4. In particular, it can be seen in the fourth curve from the top how the profile of a voltage at the gate of the power semiconductor switch ($U_{GE}$) to be switched is adjusted to a gate reference signal ($V_{Gref}$) by an exemplary turn-off circuit.

Figure 5:
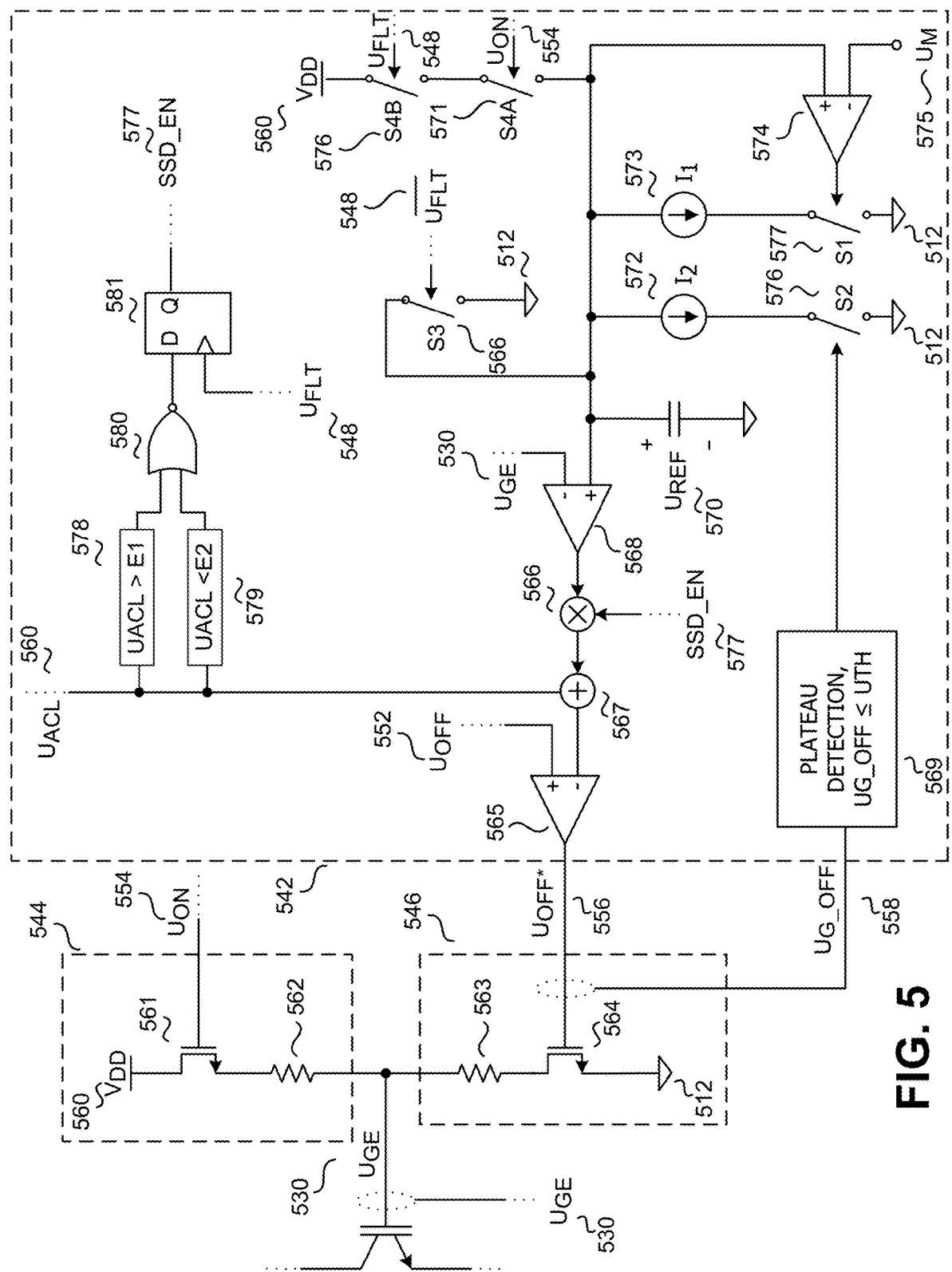
FIG. 5 shows an exemplary turn-off circuit in combination with an active clamping circuit.

FIG. 5 shows an exemplary turn-off circuit 542 in combination with an active clamping circuit. The elements of the turn-off circuit and the driver for the ON state and the OFF state in this case correspond to the respective elements shown in FIG. 3. The turn-off circuit 542 further includes a switch S3 566 which is coupled to the non-inverting input of comparator 568 and the capacitance 570 with control-input reference signal ($U_{REF}$). When there is no fault detected (fault signal $U_{FLT}$ 548 is logic low and the inverted fault signal is logic high), the switch S3 566 is closed and the voltage at the non-inverting input of comparator 568 is substantially equal to return 512. As such, similar to FIG. 3, the modified OFF signal 556 ($U_{OFF*}$) is substantially the OFF signal 552 ($U_{OFF}$). When a fault is detected (fault signal $U_{FLT}$ 548 is logic high and switch S4B 576 is on), the control-input reference signal 570 ($U_{REF}$) "starts" at a predetermined signal level, which corresponds to the determined reference potential 560 ($V_{DD}$). The control-input reference signal 570 ($U_{REF}$) is charged to the determined reference potential 560 ($V_{DD}$) when switch S4A is on (i.e. when $U_{ON}$ 554 is logic high). In addition, the turn-off circuit in FIG. 5 can be deactivated, however, when a corresponding signal 560 ($U_{ACL}$) indicates this. This means, using the example of FIG. 5, that an active clamping circuit ensures a "soft shutdown" so that the turn-off circuit does not need to become active.

In the example shown in FIG. 5, a signal level of the signal 560 ($U_{ACL}$) of approximately zero means that the active clamping circuit is inactive. If an active clamping circuit is active, the signal 560 ($U_{ACL}$) has a positive or negative level. This state is detected by the comparison circuits 578, 579 (for example by comparison of the signal level of the signal 560 ($U_{ACL}$) with a first (lower) threshold value (E1) and a second (upper) threshold value (E2)). The comparison circuits are coupled to a NOR circuit 580 so that it is detected that the signal level of the signal 560 ($U_{ACL}$) is neither above the second threshold value (E2) nor below the first threshold value (E1). Thereupon, a corresponding activation signal 577 (SSD_EN) for the turn-off circuit can be generated. For example, an output of the NOR circuit 580 can be coupled to a data input of a D flipflop 581, in response to the output of which the activation signal 566 (SSD_EN) is generated. The fault signal 548 ($U_{FLT}$) can in this case be coupled to the clock input of the D flipflop 581. This is linked to the output signal of the first comparison circuit 568 of the turn-off circuit. If, therefore, the activation signal 566 (SSD_EN) has a high signal level, the turn-off circuit engages in the turn-off operation as described further above.

If, on the other hand, the activation signal 566 (SSD_EN) has a low signal level (which indicates operation of an active clamping circuit), the influence of the turn-off circuit is suppressed. In this case, the active clamping circuit ensures a "soft shutdown". The apparatuses for activating the turn-off apparatus can be provided independently of the existence of an active clamping circuit. If, in a determined control circuit, an active clamping circuit is then provided, the apparatuses for activating the turn-off apparatus can have corresponding circuitry.

In other examples, a selection circuit for selecting between a turn-off circuit and an active clamping circuit can comprise further elements. For example, a current can be fed to the input for the signal 560 ($U_{ACL}$) prior to each turn-off operation. The additional current provided by the internal circuit and sourced to the same net (i.e. $U_{ACL}$ in FIG. 5) may be used to test if a current provided to this net would lead to a voltage at the net. If that is the case, an active clamping signal may be effective. In addition, a duration of an output pulse of the flipflop 581 in response to which the activation signal 566 (SSD_EN) is generated can be extended to a predetermined minimum duration. Alternatively, a duration of an output pulse of the comparison circuits 578, 579 can be extended to a predetermined minimum duration. With these measures, a susceptibility to faults of the selection circuit can be reduced. The above description of the examples illustrated of the present invention is not intended to be exhaustive or restricted to the examples. While specific embodiments and examples of the invention are described herein for illustrative purposes, various modifications are possible without departing from the present invention. The specific examples of voltage, current, frequency, power, range values, times, etc., are merely illustrative such that the present invention can also be implemented with other values for these variables.

These modifications can be implemented using examples of the invention in the light of the above-detailed description. The terms which are used in the claims which follow should not be interpreted as restricting the invention to the specific embodiments which are disclosed in the description and claims. The present description and the figures are to be regarded as illustrative and not as restrictive.

What is claimed is:

1. A driver circuit for a switch controller to control a power switch, the driver circuit comprising:
    an on-state driver coupled to receive an on signal, wherein the on-state driver outputs a first control signal to turn ON the power switch in response to the on signal and the first control signal is substantially equal to a high threshold;
    an off-state driver coupled to receive an off signal, wherein the off-state driver outputs the first control signal to turn OFF the power switch in response to the off signal and the first control signal is substantially equal to a low threshold; and
    a soft shutdown circuit coupled to receive the first control signal, wherein the soft shutdown circuit regulates the first control signal in a closed loop in response to a fault condition, wherein the soft shutdown circuit decreases the first control signal to a mid-threshold from the high threshold for a period of time and then decreases the first control signal to the low threshold, wherein the period of time ends in response to an end of a Miller plateau of the power switch,
    wherein the soft shutdown circuit detects the end of the Miller plateau of the power switch when the off signal reaches a first threshold.

2. The driver circuit of claim 1, wherein the off-state driver further includes a transistor, wherein the soft shutdown circuit is coupled to receive a gate signal representative of a gate current or a gate voltage of the transistor.

3. The driver circuit of claim 2, wherein the end of the Miller plateau of the power switch is detected when the gate signal of the transistor reaches the first threshold after a blanking time.

4. The driver circuit of claim 1, wherein the soft shutdown circuit further comprises:
    an amplifier coupled to receive the first control signal and a reference signal, wherein the reference signal decreases to the mid-threshold from the high threshold for the period of time and then decreases to the low threshold in response to the fault condition and the end of the Miller plateau of the power switch.

5. The driver circuit of claim 4, wherein the end of the Miller plateau of the power switch is detected when the gate signal of the transistor reaches a first threshold after a blanking time, and wherein the blanking time ends when the reference signal is substantially equal to the mid-threshold.

6. The driver circuit of claim 4, wherein the reference signal is not substantially equal to the mid-threshold for the period of time when there is not an occurrence of the fault condition.

7. The driver circuit of claim 1, wherein the driver circuit is coupled to receive an active clamping signal, and wherein the soft shutdown circuit is disabled when the active clamping signal is between a first threshold and a second threshold.

8. The driver circuit of claim 7, wherein the active clamping signal includes an additional current prior to the first control signal turning OFF the power switch.

9. The driver circuit of claim 1, wherein the fault condition corresponds to an overcurrent condition of the power switch.

10. A method for turning off a semiconductor switch, comprising:
    generating a control-input reference signal;
    adjusting a resistance of an element having a variable resistance in response to the control-input reference signal in a closed control loop in order to turn off the semiconductor switch, wherein the element is coupled to a control input of the semiconductor switch;
    detecting an end of a Miller plateau in a control input voltage or in a control input current of the semiconductor switch; and
    reducing a level of the control-input reference signal in response to a detection of the end of the Miller plateau at a predetermined rate,
    wherein the end of the Miller plateau is detected on a basis of a voltage at the control input of the element falling below a predetermined signal level, and wherein the predetermined signal level is determined by a reference current and a second element that is based on a same technology as the element having a variable resistance.

11. The method of claim 10 wherein the predetermined signal level is in a range of 50% to 150% of an expected gate threshold voltage of the element having a variable resistance.

12. The method of claim 10, further comprising:
    detecting a voltage at the control input of the semiconductor switch, and wherein the resistance of the element having a variable resistance is adjusted in response to the control-input reference signal and the voltage at the control input of the semiconductor switch.

13. The method of claim 12, further comprising:
comparing the control-input reference signal with the voltage at the control input of the semiconductor switch to generate an output.

14. The method of claim 13, further comprising:
generating a control signal for the element having a variable resistance in response to a comparison of the output with a fault signal, wherein the fault signal is indicative of a fault state of the semiconductor switch.

15. The method of claim 10, wherein the end of the Miller plateau is detected on a basis of a voltage across the element having a variable resistance, a current at the control input of the semiconductor switch, a voltage across the semiconductor switch, or a current through the semiconductor switch.

16. The method of claim 15, further comprising:
detecting the resistance of the element having a variable resistance on a basis of the control-input reference signal and the voltage across the element having a variable resistance, the current at the control input of the semiconductor switch, the voltage across the semiconductor switch, or the current through the semiconductor switch.

17. The method of claim 10, further comprising:
generating a deactivation signal that prevents the adjusting of the resistance of the element having a variable resistance in response to the control-input reference signal.

* * * * *